United States Patent
Goeoetz et al.

(10) Patent No.: US 9,806,240 B2
(45) Date of Patent: Oct. 31, 2017

(54) WAVELENGTH CONVERSION ELEMENT, LIGHT-EMITTING SEMICONDUCTOR COMPONENT INCLUDING A WAVELENGTH CONVERSION ELEMENT, METHOD FOR PRODUCING A WAVELENGTH CONVERSION ELEMENT AND METHOD FOR PRODUCING A LIGHT-EMITTING SEMICONDUCTOR COMPONENT INCLUDING A WAVELENGTH CONVERSION ELEMENT

(71) Applicant: OSRAM Opto Semiconductors GmbH, Regensburg (DE)

(72) Inventors: Britta Goeoetz, Regensburg (DE); Christopher A. Tarry, Portsmouth, NH (US)

(73) Assignee: OSRAM OPTO Semiconductors GmbH, Regensburg (DE)

( * ) Notice: Subject to any disclaimer, the term of this patent is extended or adjusted under 35 U.S.C. 154(b) by 0 days.

(21) Appl. No.: 15/120,755

(22) PCT Filed: Mar. 5, 2015

(86) PCT No.: PCT/EP2015/054668
§ 371 (c)(1),
(2) Date: Aug. 23, 2016

(87) PCT Pub. No.: WO2015/135839
PCT Pub. Date: Sep. 17, 2015

(65) Prior Publication Data
US 2017/0062672 A1 Mar. 2, 2017

Related U.S. Application Data (60) Provisional application No. 61/950,574, filed on Mar. 10, 2014.

(51) Int. Cl.
*H01L 33/00* (2010.01)
*H01L 33/50* (2010.01)
(Continued)

(52) U.S. Cl.
CPC ........ *H01L 33/508* (2013.01); *C09K 11/7774* (2013.01); *H01L 33/50* (2013.01);
(Continued)

(58) Field of Classification Search
CPC ..... H01L 33/50; H01L 33/501; H01L 33/505; H01L 33/507; H01L 33/508
See application file for complete search history.

(56) References Cited

U.S. PATENT DOCUMENTS 8,921,876 B2 * 12/2014 van de Ven ........... H01L 33/507
257/98
2002/0167262 A1 11/2002 Porter et al.
(Continued)

FOREIGN PATENT DOCUMENTS

EP 2677232 A1 12/2013
WO 2010067291 A1 6/2010

OTHER PUBLICATIONS

International Search Report based on application No. PCT/EP2015/054668 (5 pages) dated May 26, 2015 (for reference purpose only).

*Primary Examiner* — Minh-Loan Tran
(74) *Attorney, Agent, or Firm* — Viering, Jentschura & Partner mbB (57) ABSTRACT

Various embodiments may relate to a wavelength conversion element including at least one sintered wavelength converting material, wherein a grid is formed by channels within the sintered wavelength converting material, the channels are at least partially surrounded by the sintered wavelength converting material, the channels reach at least partially through the sintered wavelength converting material in a direction
(Continued)

perpendicular or oblique to a main extension direction of the wavelength conversion element, and the channels contain a non-converting sintered separator material.

15 Claims, 7 Drawing Sheets

(51) Int. Cl.
    *C09K 11/77*      (2006.01)
    *H01L 25/075*      (2006.01)

(52) U.S. Cl.
    CPC .......... *H01L 33/501* (2013.01); *H01L 33/505* (2013.01); *H01L 33/507* (2013.01); *H01L 25/0753* (2013.01); *H01L 2924/0002* (2013.01); *H01L 2933/0041* (2013.01)

(56) References Cited

U.S. PATENT DOCUMENTS

| | | |
|---|---|---|
| 2009/0039375 A1 | 2/2009 | LeToquin et al. |
| 2010/0301360 A1 | 12/2010 | van de Ven et al. |
| 2013/0258638 A1 | 10/2013 | Wang et al. |
| 2014/0167605 A1* | 6/2014 | Park .................. H05B 33/10 313/506 |
| 2014/0339573 A1* | 11/2014 | Zimmerman ......... H01L 33/641 257/88 |

\* cited by examiner

WAVELENGTH CONVERSION ELEMENT, LIGHT-EMITTING SEMICONDUCTOR COMPONENT INCLUDING A WAVELENGTH CONVERSION ELEMENT, METHOD FOR PRODUCING A WAVELENGTH CONVERSION ELEMENT AND METHOD FOR PRODUCING A LIGHT-EMITTING SEMICONDUCTOR COMPONENT INCLUDING A WAVELENGTH CONVERSION ELEMENT

RELATED APPLICATIONS

The present application is a national stage entry according to 35 U.S.C. §371 of PCT application No.: PCT/EP2015/054668 filed on Mar. 5, 2015, which claims priority from U.S. provisional application No. 61/950,574 filed on Mar. 10, 2014, and is incorporated herein by reference in its entirety.

TECHNICAL FIELD

A wavelength conversion element and a method for producing a wavelength conversion element are specified. A light-emitting semiconductor component including a wavelength conversion element and a method for producing a light-emitting semiconductor component including a wavelength conversion element are furthermore specified.

SUMMARY

Certain embodiments specify a wavelength conversion element for a light-emitting semiconductor component. Further embodiments specify a method for producing a wavelength conversion element. Other embodiments specify a light-emitting semiconductor component including a wavelength conversion element and a method for producing such a light-emitting semiconductor component.

In accordance with at least one embodiment, a wavelength conversion element includes at least one sintered wavelength converting material. The wavelength conversion element can be self-supporting. The wavelength conversion element can be stable without any mechanical supporting or stabilizing components. The wavelength conversion element has a main extension plane. In particular, the wavelength conversion element is shaped like a sheet or plate and has a larger dimension in directions along the main extension plane than in the direction perpendicular to the main extension, which corresponds to the thickness of the wavelength conversion element. Further, the wavelength conversion element can include a plurality of layers and/or sheets. For example the layers and/or sheets can contain the same sintered wavelength converting material or each of the layers and/or sheets can contain a wavelength converting material that is different from the wavelength converting material of the other layers and/or sheets. In addition one of the said layers can contain an undoped layer which can inter alia serve as a supporting layer and/or sheet, wherein the undoped layer can be arranged opposite to a radiation exit area of the wavelength conversion element.

The term "sintered" means that the herein described wavelength converting material is treated or baked under a high temperature to obtain inter alia a required density of the wavelength converting material.

The term "wavelength converting material" means that the said material is able to convert at least a part of a primary radiation with a first peak wavelength into a secondary radiation with a second peak wavelength, wherein the second peak wavelength is different from the first peak wavelength. In particular, the wavelength converting material can absorb the primary radiation and can reemit the secondary radiation.

In accordance with at least one embodiment, a grid is formed by channels within the sintered wavelength converting material. The forming of the grid can inter alia be accomplished by slicing, stamping and/or embossing. The grid can form, together with the sintered wavelength converting material, the wavelength conversion element in which the sintered wavelength converting material forms regions which are at least partially separated from one another by the grid and which can convert light, which is irradiated onto the wavelength conversion element, into light which is different from an incident light.

In accordance with at least one embodiment, the channels are at least partially surrounded by the sintered wavelength converting material and the channels reach at least partially through the sintered wavelength converting material in a direction perpendicular or oblique to a main extension direction of the wavelength conversion element and the channels contain a non-converting sintered separator material. The main direction of the wavelength conversion element runs parallel to the herein described main extension plane of the wavelength conversion element. For example, lateral faces or surfaces of the channels are formed by interfaces between the sintered wavelength converting material and the non-converting sintered separator material. A bottom face of the channels is formed by an interface between the non-converting sintered separator material and the sintered wavelength converting material, or the bottom face of the channels is formed between the non-converting sintered separator material and the undoped layer or the layers and/or sheets containing the sintered wavelength converting material. A shape of the channels can be rectangular, square, triangular or trapezoid.

The non-converting sintered separator material can be filled in the channels such that it forms a common planar surface with the sintered wavelength converting material. It is further conceivable that the non-converting sintered separator material projects beyond the sintered wavelength converting material in a vertical direction, wherein the vertical direction runs obliquely to the main extension direction. For example, the non-converting sintered separator material fills the channels completely, such that the sintered wavelength converting material and the non-converting sintered separator material are in direct contact and no gaps are present between the sintered wavelength converting material and the non-converting sintered separator material.

The term "non-converting" means that the sintered separator material is not able to convert the wavelength of the primary radiation. The non-converting sintered separator material does not change or absorb and reemit the wavelength of the primary radiation, except the emission of infrared and/or thermal radiation. The non-converting sintered separator material can, for example, totally absorb or reflect any radiation that impinges on it.

In accordance with at least one embodiment of a wavelength conversion element, the wavelength conversion element includes at least one sintered wavelength converting material, wherein a grid is formed by channels within the sintered wavelength converting material, the channels are at least partially surrounded by the sintered wavelength converting material, the channels reach at least partially through the sintered wavelength converting material in a direction perpendicular or oblique to a main extension direction of the wavelength conversion element and the channels contain a non-converting sintered separator material.

A further refinement of the above mentioned embodiment includes a grid of channels containing a non-converting sintered separator material, whereby the grid has first channels running in a first direction and second channels running in a second direction, and whereby the first and the second directions are parallel to the main extension direction of the wavelength conversion element. The first and second directions are preferably perpendicular or oblique to each other so that the first and second channels cross each other. The depth of the first channels may be equal to or different from the depth of the second channels. In particular, if the depths are different, the first channels may cut completely through the sintered wavelength converting material while the second channels reach only partly through the sintered wavelength converting material. The first channels with a greater depth, e.g. channels cutting completely through the sintered wavelength converting material, reduce more efficiently crosstalk between adjacent wavelength converting areas. The second channels with a lesser depth, e.g. channels reaching only partly through the sintered wavelength converting material increase the mechanical stability of the wavelength conversion element.

In accordance with at least one embodiment, a method for producing a wavelength conversion element includes a step A in which a support sheet with a top side and a bottom side lying opposite the top side is provided. The top side and the bottom side can be connected to each other by a common side face, wherein the side face runs obliquely, in particular perpendicular, to the top side or the bottom side. The support sheet can, for example, include a polymer material, a ceramic material and/or glass. The support sheet can inter alia serve to stabilize the wavelength conversion element during the production of the wavelength conversion element if, for example, channels run completely through the wavelength conversion element. It is also possible that the support sheet is a foil or plate. For example, the foil can be a polymer foil such as a polyester foil. For example, Mylar foils can be provided as the support sheet.

In accordance with at least one embodiment of the method for producing the wavelength conversion element, in a method step B a wavelength converting material on the top side of the support sheet is provided. The herein described wavelength converting material can be unsintered. That is to say that the wavelength converting material has a pasty, semifluid and/or viscous state and is in particular not yet treated by heat or dried. In order to provide the wavelength converting material on the top side of the support sheet it is possible, for example, to produce a slurry or a paste including the wavelength converting material. By means of a suitable casting method, it is possible to spread the wavelength converting material on the top side of the support sheet in the form of a layer or a green tape, for example in the form of a plate or a tape, from the slurry or the paste.

In this case, it can also be possible that a plurality of layers or green tapes produced in this way are laminated onto one another in order to achieve the desired thickness of the green body and thus of the wavelength conversion element. In particular, a plurality of green layers composed of the unsintered wavelength converting material can thus also be applied one on top of another in order to form the wavelength conversion element, such that the layer composed of the unsintered wavelength converting material that is produced in method step B can also be formed from a plurality of such layers. The wavelength conversion element can correspondingly include one or a plurality of layers of the wavelength converting material, which are sintered together in the completed state of the wavelength conversion element. The embodiments described herein and hereinafter therefore relate both to methods in which only one layer composed of an unsintered wavelength converting material is produced and to methods in which a plurality of layers composed of the unsintered wavelength converting material are applied and laminated onto one another.

In accordance with at least one embodiment of the method for producing the wavelength conversion element, in a method step C the wavelength converting material is directly or indirectly patterned, thereby forming channels in the wavelength converting material which are at least partially surrounded by the wavelength converting material. The forming of the grid can inter alia be accomplished by slicing, stamping, embossing, sawing and/or dicing, e.g. laser dicing. The patterning can be conducted to the wavelength converting material in an unsintered, dried or sintered state. A patterning in the sintered state requires usually more severe patterning methods like sawing or dicing, e.g. laser dicing.

In particular, the direct patterning can preferably be conducted to the wavelength converting material after drying.

In particular, the indirect patterning can preferably be conducted to the wavelength converting material in the unsintered state in form of the slurry or the paste. The wavelength conversion element can already be self-supporting after drying the wavelength converting material and the support sheet can be removed to obtain the wavelength conversion element.

In accordance with at least one embodiment of the method for producing the wavelength conversion element, in a method step D the channels are filled with a slurry of non-converting separator material.

In accordance with at least one embodiment of the method for producing the wavelength conversion element, in a method step E the wavelength conversion element is sintered. Due to the sintering process the wavelength converting material and the slurry of non-converting separator material achieve a required density.

In accordance with at least one embodiment of a method, the method includes the following steps:
A) providing a support sheet with a top side and a bottom side lying opposite the top side,
B) providing a wavelength converting material on the top side of the support sheet,
C) patterning the wavelength converting material directly or indirectly, thereby forming channels in the wavelength converting material which are at least partially surrounded by the wavelength converting material,
D) filling the channels with a slurry of non-converting separator material,
E) sintering the wavelength conversion element.

Putting a wavelength conversion element on a pixelated light emitting device (LED) is challenging, especially when an optical separation between the pixels is desired in order to prevent cross-talk. The handling of single pixel wavelength conversion elements becomes difficult with an decreasing size of the pixels in particular if the size of converting regions, elements or sections get smaller than 500 μm. The idea here is to produce a single wavelength conversion element that contains sintered wavelength converting material and non-converting sintered separator material in one piece to prevent crosstalk. In the case of the wavelength conversion element described herein, optical crosstalk between the wavelength converting material can be prevented by the grid formed within the wavelength converting material and the non-converting separator material which is filled in the channels of the grid.

That can be advantageous in particular if each region containing the wavelength converting material is assigned to a luminous segment of a light-emitting semiconductor chip. On the basis of the method described herein, a large wavelength conversion element, that is to say a wavelength conversion element for example of the size of the light-emitting semiconductor chip, can advantageously be processed without the individual converting regions containing the wavelength converting material having to be individually processed and positioned. As a result, it is possible that an alignment of the individual converting regions need only be carried out once, namely during an adjustment of the wavelength conversion element, and it is not necessary for each of the converting regions containing the wavelength converting material to be aligned independently of one another.

The embodiments and features described herein apply equally to the wavelength conversion element and to the method for producing the wavelength conversion element.

In accordance with at least one embodiment, the channels extend at least partially parallel in the main extension direction of the wavelength conversion element. For example the channels are spaced apart from each other and have a constant distance to each other so that the grid within the sintered wavelength converting material shows cells which are shaped like a rhomboid, a diamond, a rectangular or a square.

In accordance with at least one embodiment, the channels completely reach through the sintered wavelength converting material or the channels partially reach through the sintered wavelength converting material. In the case that the channels completely reach through the sintered wavelength converting material, the sintered wavelength converting material can be supported by the support sheet, wherein lateral faces of the channels are formed by the interfaces between the sintered wavelength converting and the non-converting sintered separator material and a bottom face of the channels is formed by the interface between the sintered wavelength converting material and the support sheet. Further, the channels can be formed in the sintered wavelength converting material as recesses which include the lateral faces and the bottom face, wherein the lateral faces and the bottom face are the interfaces between the sintered wavelength converting material and the non-converting sintered separator material.

In accordance with at least one embodiment, the non-converting sintered separator material is non-transmissive to ultraviolet and/or visible light. The ultraviolet and/or visible light can be emitted by a light-emitting semiconductor chip, for example. In particular the non-converting sintered separator material absorbs the ultraviolet and/or visible light, wherein the non-converting sintered separator material inter alia contains carbon black. The non-converting sintered separator material can be chosen in such a way that the grid appears black to an observer on account of its absorption properties.

In accordance with at least one embodiment, the non-converting sintered separator material is reflective to the ultraviolet and/or visible light. For this purpose the non-converting sintered separator material can, for example, contain radiation-reflecting particles. The radiation-reflecting particles are formed with at least one of the materials $Al_2O_3$, $SiO_2$, $TiO_2$, $ZrO_2$ or contain at least one or more of said materials. Additionally or alternatively, one or more of the following materials are also possible: $ZnO$, $BaSO_4$, $MgO$, $Ta_2O_5$, $HfO_2$, $Gd_2O_3$, $Nb_2O_3$, $Y_2O_3$. A concentration of the radiation-reflecting particles in the non-converting sintered separator material can preferably be greater than or equal to 10% by weight or greater than or equal to 20% by weight. The concentration of the radiation-reflecting particles, in particular of radiation-reflecting particles containing $TiO_2$ or $Al_2O_3$, can e.g. be greater than or equal to 10% by weight and less than or equal to 100%. In a further preferred embodiment, the non-converting sintered separator material includes radiation-reflecting particles containing $TiO_2$ with a concentration of 90% or more by weight, and $Al_2O_3$ with a concentration of 10% or less by weight. Furthermore, the non-converting sintered separator material may in general contain a sintering aid, e.g. an oxide like the above mentioned oxides, preferably $MgO$ or $Y_2O_3$. A preferred concentration of the sintering aid is greater than or equal to 0.01% and less than or equal to 5% by weight.

The radiation-reflecting particles can preferably be distributed uniformly within the non-converting sintered separator material.

The non-converting sintered separator material can be chosen in such a way that the grid appears white to an observer on account of its reflection properties.

In accordance with at least one embodiment, the sintered wavelength converting material contains a doped ceramic material selected from one or more of the following materials: YAG:Ce, LuAG:Ce, LuYAG:Ce. In preferred embodiments, ceramic materials can be used as the sintered wavelength converting material, for example garnets such as, for instance, yttrium aluminum oxide (YAG), lutetium aluminum oxide (LuAG), lutetium yttrium aluminum oxide (LuYAG) and terbium aluminum oxide (TAG). In further preferred embodiments, the ceramic materials for the sintered wavelength converting material are doped, for example, with one of the following activators: cerium, europium, neodymium, terbium, erbium, praseodymium, samarium, manganese. By way of example, for possible doped ceramic sintered wavelength converting materials, YAG:Ce, LuAG:Ce and LuYAG:Ce shall be mentioned. The doped ceramic material can preferably have a content of Ce of greater than or equal to 0.1% and less than or equal to 4%.

In accordance with at least one embodiment, the sintered wavelength converting material contains one or more materials selected from the group: (AE)SiON, (AE)SiAlON, (AE)AlSiN$_3$, (AE)$_2$Si$_5$N$_8$, wherein AE is an alkaline earth metal or sulfides or orthosilicates.

The sintered wavelength converting material can include any of the here mentioned light converting materials or consist thereof.

In accordance with at least one embodiment, the sintered wavelength converting material contains a wavelength conversion substance dispersed in a matrix material. Furthermore, it is also possible for the sintered wavelength converting material to include the wavelength conversion substance, for example in powder form, in the matrix material.

In accordance with at least one embodiment, the direct patterning includes the steps wherein the channels are formed in a grid-like pattern within the wavelength converting material by selectively removing the wavelength converting material, whereby the channels completely reach, at least in places, through the wavelength converting material, and whereby regions at least partially free of the wavelength converting material are formed. The selective removing can be accomplished by slicing, stamping and/or embossing. The channels can completely reach through the sintered wavelength converting material, wherein the sintered wavelength converting material can be supported by the support sheet.

In accordance with at least one embodiment, direct patterning is performed such that in addition the channels reach at least partially through the support sheet. For example, the selective removing can be accomplished such that the slicing, stamping and/or embossing also partially removes the material of the support sheet. The channels can then be filled with the slurry of the non-converting separator material. After sintering the wavelength conversion element contains in particular the sintered wavelength converting material as well as the sintered non-converting separator material in the here described manner. The support sheet can be further delaminated or removed from the then sintered or accordingly produced wavelength conversion element, wherein the sintered non-converting separator material overtops the sintered wavelength converting material in the vertical direction.

In accordance with at least one embodiment, the indirect patterning includes the steps wherein removable insular regions are brought on the top side of the support sheet, wherein the removable insular regions are spaced apart from each other, the wavelength converting material is filled at least in places between the removable insular regions, and the insular regions are removed from the top side of the support sheet, thereby forming the channels in the wavelength converting material. For example, the insular regions are formed by a patterning process like photolithography, also known as optical lithography or UV lithography, wherein light is used to transfer a geometric pattern from a photomask to a layer made of the material of the removable insular regions on the top side of the support sheet. For example, the removable insular regions include the grid-like pattern, wherein regions free of the removable material are located between each insular region. These regions can be filled with the slurry or paste of the unsintered wavelength converting material by means of the casting method.

The unsintered wavelength converting material can, for example, form a common planar surface with the removable insular regions. After drying the unsintered wavelength converting material the insular regions can be removed by chemical means. This can, for example, require a liquid so-called "resist stripper", which chemically alters the insular regions so that they no longer adhere to the support sheet and/or the wavelength converting material, for example. Alternatively, the insular regions may be removed by a plasma containing oxygen, which oxidizes them. This process is called asking, and resembles dry etching. Thereby channels are formed in the wavelength converting material which can then be filled with the slurry or the paste of the non-converting separator material.

Considering the indirect patterning it is further conceivable to firstly pattern the non-converting separator material using the removable insular regions as described here and secondly fill the cells of the grid with the slurry or the paste of the wavelength converting material. For example the here described channels and cells are exchangeable, that is to say that the wavelength converting material is structured and applied with the here described method for the non-converting separator material and the non-converting separator material is structured and applied with the here described method for the wavelength converting material. In other words the here described method may be proceeded vice versa.

In a further embodiment the slurry or the paste of the wavelength converting material can overlap the removable insular regions on the top side of the support sheet such that the wavelength converting material exclusively forms the common planar surface. The support sheet can be removed after drying the wavelength converting material. The then exposed removable insular regions can be removed by the herein described "resist stripper", which chemically alters the insular regions so that they no longer adhere to the dried wavelength converting material. The thereby formed channels can be filled with the slurry or the paste of the non-converting separator material. The common planar surface including the wavelength converting material and the non-converting separator material can be denoted as a radiation exit area of the wavelength conversion element which may be based on the direct or indirect patterning of the wavelength converting material.

In accordance with at least one embodiment, the removable insular regions include or can consist of a photoresist. A photoresist is a light-sensitive material which is particularly advantageous for the herein described patterning process like photolithography. For example, the photo resist includes or consists of one of the following materials: Poly(methyl methacrylate) (PMMA), Poly(methyl glutarimide) (PMGI), Phenol formaldehyde resin (DNQ/Novolac) or SU-8.

In accordance with at least one embodiment, the support sheet includes an undoped ceramic sheet. The undoped ceramic sheet includes a non-converting ceramic material and is preferably composed of a non-converting ceramic material. In particular, the undoped ceramic sheet can include or be composed of one or more undoped ceramic materials selected from yttrium aluminum oxide (YAG), aluminum oxide ($Al_2O_3$), yttrium oxide ($Y_2O_3$), titanium oxide ($TiO_2$) and aluminum nitride (AlN).

For example the support sheet can be a part of the wavelength conversion element.

In accordance with at least one embodiment, the wavelength conversion element is pre-sintered before sintering. In particular during the pre-sintering process binders within the wavelength converting material and the non-converting separator material are removed.

In accordance with a further embodiment, a light-emitting semiconductor component includes a light-emitting semiconductor chip, which emits primary radiation during operation via a light coupling-out surface along an emission direction, and the herein described wavelength conversion element, wherein the wavelength conversion element is arranged on the light coupling-out surface of the light-emitting semiconductor chip. The semiconductor chip can be, in particular, a pixilated light-emitting semiconductor chip. The light-emitting semiconductor chip can emit the primary radiation, for example blue and/or ultraviolet light, via the light coupling-out surface along the emission direction, which runs obliquely to the main extension plane of the wavelength conversion element or the light-emitting semiconductor component. The wavelength conversion element is applied, for example adhesively bonded, on the light coupling-out surface of the light-emitting semiconductor chip.

BRIEF DESCRIPTION OF THE DRAWINGS

In the drawings, like reference characters generally refer to the same parts throughout the different views. The drawings are not necessarily to scale, emphasis instead generally being placed upon illustrating the principles of the disclosed embodiments. In the following description, various embodiments described with reference to the following drawings, in which.

DETAILED DESCRIPTION

In the exemplary embodiments and figures, elements that are identical, of identical type or act identically may in each case be provided with the same reference signs. The illustrated elements and their size relationships among one another should not be regarded as true to scale; rather, individual elements, such as, for example, layers, component parts, components and regions may be illustrated with an exaggerated size in order to enable better illustration and/or in order to afford a better understanding.

FIGS. 1A to 1E show method steps for producing a wavelength conversion element 1 in accordance with one exemplary embodiment.

Figure 1A:
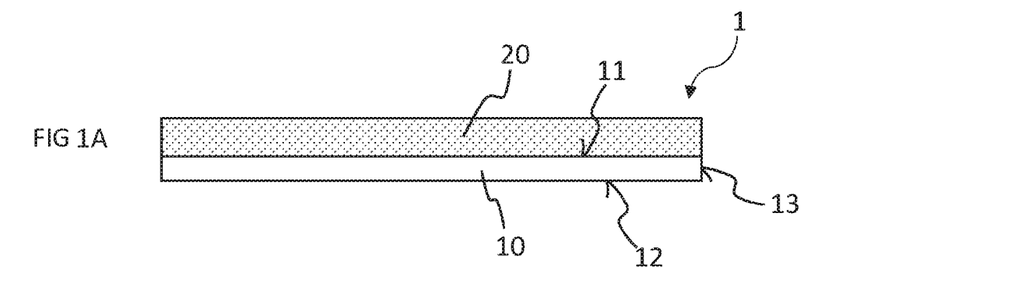
FIGS. 1A to 1E show schematic illustrations of method steps for a method for producing a wavelength conversion element in accordance with one exemplary embodiment.

In a first method step, as shown in FIG. 1A, a support sheet 10 with a top side 11 and a bottom side 12 lying opposite the top side 11 is provided. The top side 11 and the bottom side are connected to each other by a common side face 13, wherein the side face 13 runs perpendicular to a main extension direction or plane of the wavelength conversion element 1. A wavelength converting material 20 is arranged on the top side 11 of the support sheet 10. The wavelength converting material 20 is flush with the side face 13 of the support sheet. In this method step the wavelength converting material 20 can be a slurry or a paste and a casting method can be used to bring the wavelength converting material 20 on the top side 11 of the support sheet 10.

Figure 1B:
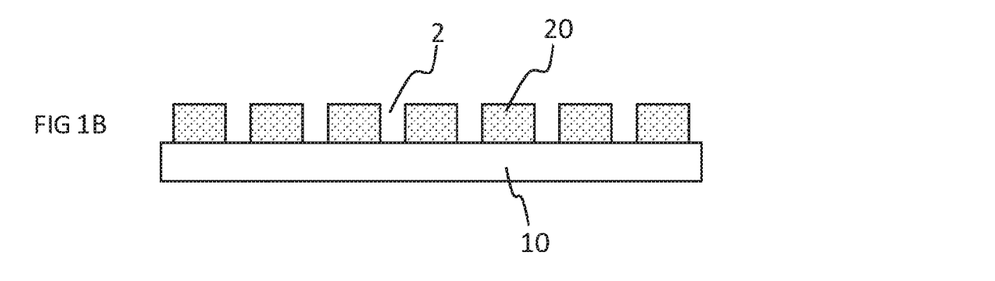
Figure 1C:
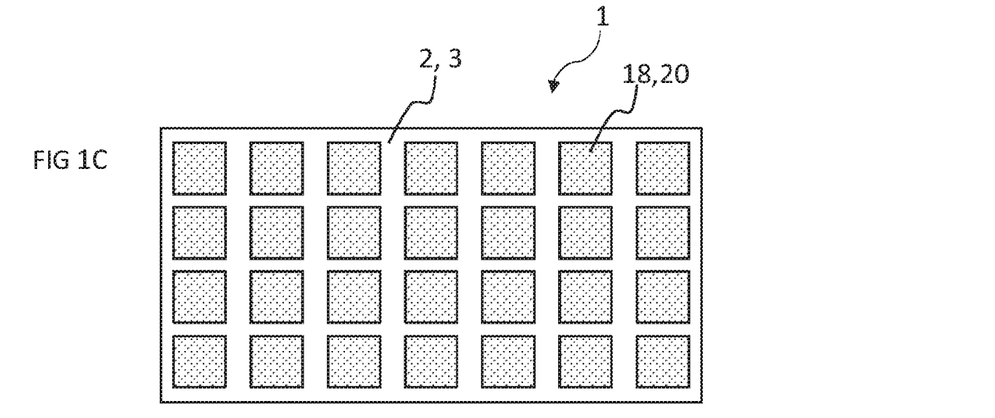

In a further method step in accordance with FIG. 1B the wavelength converting material 20 is directly patterned such that channels 2 are formed in a grid-like pattern within the wavelength converting material 20 by selectively removing the wavelength converting material 20 (see also FIG. 1C). The slurry or the paste of the wavelength converting material 20 can then be dried such that the wavelength converting material can, in particular, be patterned in a direct manner. The channels 2 reach completely through the wavelength converting material 20 in a direction perpendicular to the main extension direction of the wavelength conversion element 1.

As shown in FIG. 1B, after selectively removing the wavelength converting material 20 regions containing the wavelength converting material 20, which are spaced apart from each other, are produced. The spaces or the channels between the wavelength converting material 20 are free of the wavelength converting material 20. In particular the channels 2 are delimited by the wavelength converting material 20 in a lateral direction and by the support sheet 10 in a vertical direction, wherein the lateral direction runs parallel to the main extension plan of the wavelength conversion element and the vertical direction perpendicular or oblique to the lateral direction.

In addition to FIG. 1B, FIG. 1C shows a top view of the wavelength conversion element 1, wherein a grid 3 formed by the channels 2 within the wavelength converting material 20 is shown. The channels 2 are delimited by the wavelength converting material 20 in the lateral direction, wherein in the vertical direction the wavelength converting material 20 is delimited by the support sheet 10. FIG. 1C shows further cells 18 containing the wavelength converting material 20 which are shaped like a rectangle or a square.

Figure 1D:
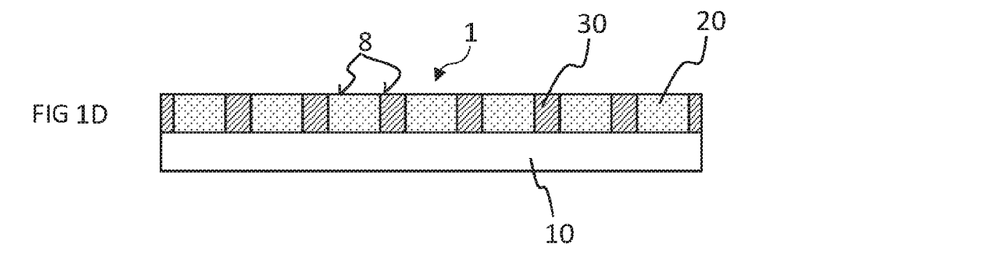

In a further method step, as shown in FIG. 1D, the channels 2 or the grid 3 are filled with a slurry or paste of non-converting separator material 30, respectively.

As shown in FIG. 1D, the wavelength converting material 20 and the non-converting separator material 30 form a common planar surface 8, which inter alia can serve as a radiation exit area of the wavelength conversion element 1. The non-converting separator material 30 is flush with the wavelength converting material 20 in the vertical direction.

The wavelength conversion element 1 as shown in FIG. 1D can then be sintered. During the sintering process the wavelength conversion element is sintered to a required density. Further, the wavelength conversion element 1 can also be pre-sintered so that binders can be removed. The support sheet 10 can include or consist of an undoped ceramic sheet. For example, the wavelength conversion element shown in FIG. 1D can be a so-called green body. In the case that the support sheet 10 includes or consists of an undoped ceramic sheet after the pre-sintering or sintering process, the support sheet 10 may be a part of the wavelength conversion element 1 and is not removed from the wavelength conversion element 1.

Further, the support sheet 10 can include or consist of a polymer material, a ceramic material and/or glass.

Figure 1E:
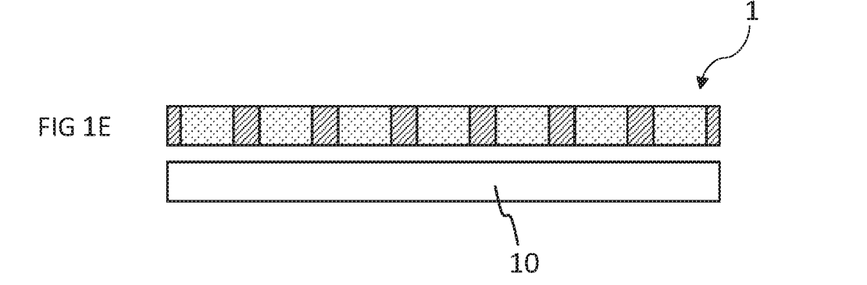

In a further method step, as shown in FIG. 1E, the support sheet 10 is removed or detached from the wavelength conversion element 1 which now includes the sintered wavelength converting material and the non-converting sintered separator material. The such obtained wavelength conversion element 1 can be self-supporting and does not need any supporting components.

Figure 1F:
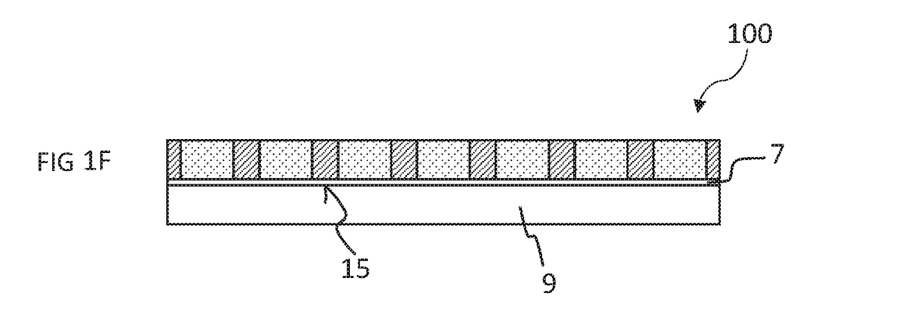
FIG. 1F shows a schematic side view of a light-emitting semiconductor component including the wavelength conversion element in accordance with FIGS. 1A to 1E, FIGS. 2A to 2E show schematic illustrations of method steps for a method for producing a wavelength conversion element in accordance with one exemplary embodiment.

FIG. 1F shows a light-emitting semiconductor component 100, wherein the wavelength conversion element 1 is glued onto a light coupling-out surface 15 of a light-emitting semiconductor chip 9. The here shown light-emitting semiconductor chip 9 can be a pixilated light-emitting semiconductor chip. As shown in FIG. 1F, an adhesive layer 7 is arranged between the wavelength conversion element 1 and the light-emitting semiconductor chip 9.

Thus, FIG. 1F shows a schematic side view of a light-emitting semiconductor component 100 including the wavelength conversion element 1 and the light-emitting semiconductor chip 9 wherein the wavelength conversion element 1 is based on the method steps as shown in FIGS. 1A to 1E.

FIGS. 2A to 2E show schematic illustrations of the method steps as described in FIGS. 1A to 1E. The method steps shown in FIGS. 2A to 2E are based on the same method as described for FIGS. 1A to 1E with the difference that the channels 2 that are formed in the, for example, dried wavelength converting material 20 and the channels 2 are shaped in triangular fashion shown in FIG. 2B. In particular, the triangular shape of the channels 2 can also be trapezoid. The further difference to the method steps shown in FIGS. 1A to 1E is that the channels 2 reach completely through the wavelength converting material 20 and at least partially in the support sheet 10, wherein the support sheet 10 may be a thin foil and/or plate. Consequently, after filling the channels 2 or the grid 3 respectively, the non-converting separator material 30 overlaps or projects above the wavelength converting material 20 in the vertical direction.

After sintering the wavelength conversion element 1, which is based on the method steps as shown in FIGS. 2A to 2D, the wavelength conversion element 1 is pre-sintered and/or sintered. After the pre-sintering and/or sintering step the support sheet 10 can be removed or detached from the wavelength conversion element 1 and the wavelength conversion element 1 is glued onto the light-emitting, for example pixilated, semiconductor chip 9 such that regions of the non-converting sintered separator material 30 which overtops the sintered wavelength converting material 20 are positioned or arranged in a opposite direction to the light-emitting semiconductor chip 9.

Figure 2A:
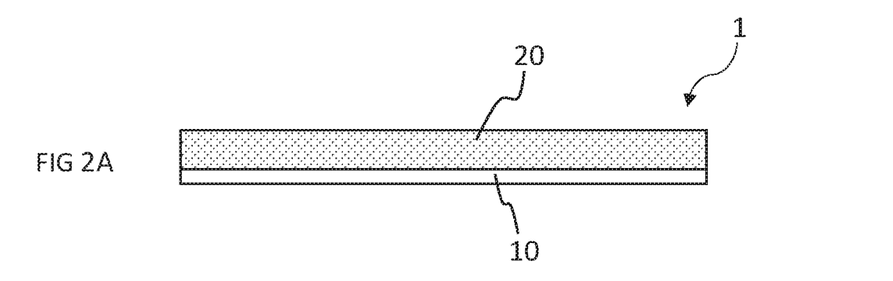
Figure 2B:
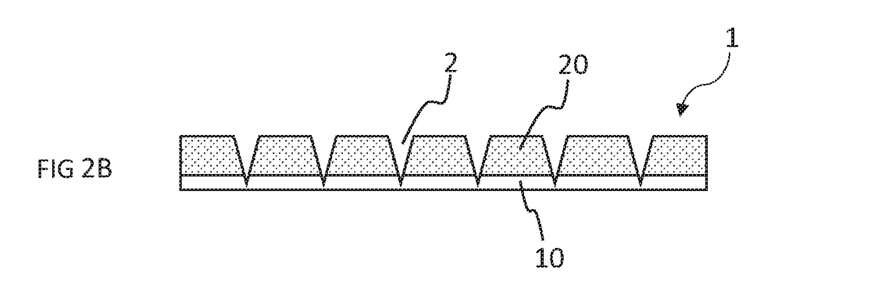
Figure 2C:
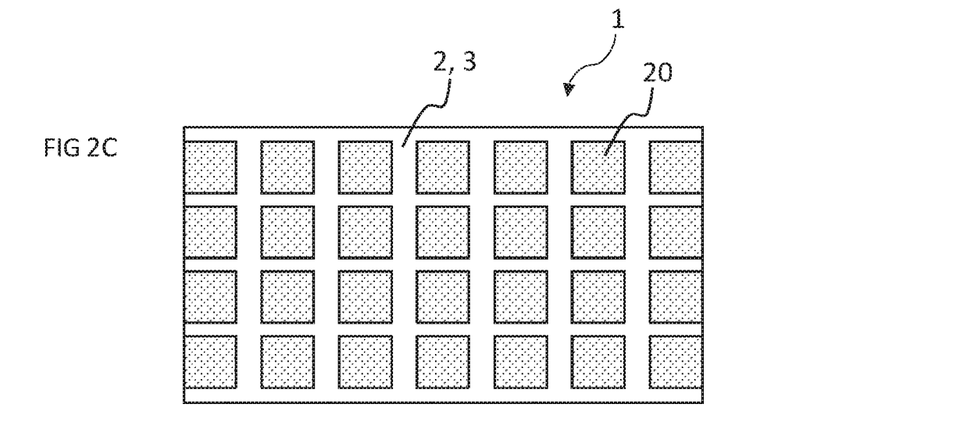
Figure 2D:
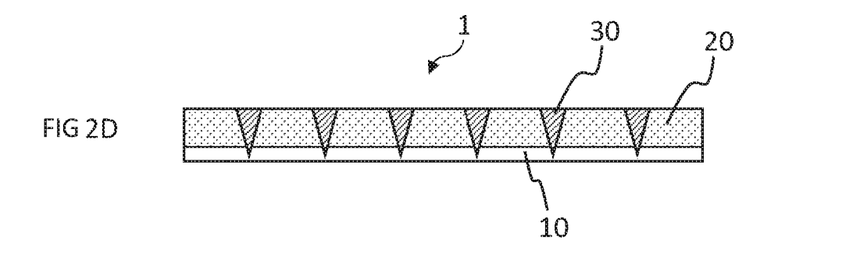
Figure 2E:
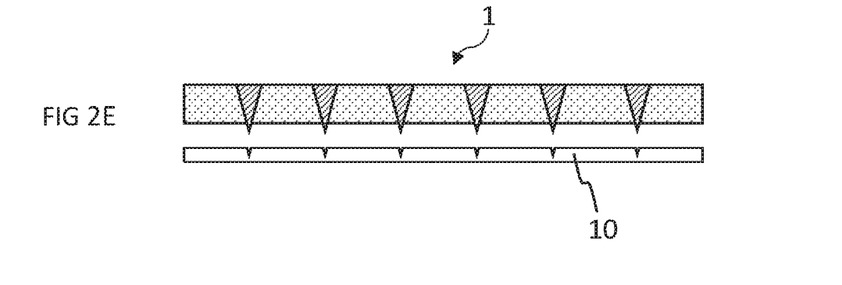
Figure 2F:
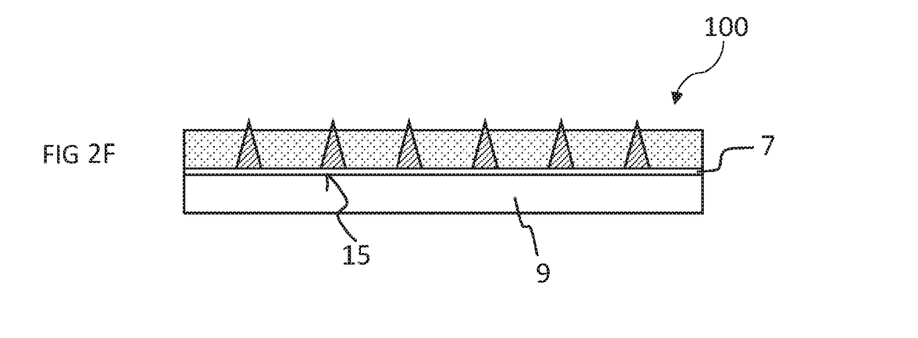
FIG. 2F shows a schematic side view of a light-emitting semiconductor component including the wavelength conversion element in accordance with FIGS. 2A to 2E, FIGS. 3A to 3G show schematic illustrations of method steps for a method for producing a wavelength conversion element in accordance with one exemplary embodiment.

As already shown in FIG. 1F, also in FIG. 2F the adhesive layer 7 can be arranged between the wavelength conversion element 1 and the light-emitting semiconductor chip 9. Thus in FIG. 2F the light-emitting semiconductor component 100 is shown. Consequently, FIG. 2F shows a schematic side view of the light-emitting semiconductor component 100 including the wavelength conversion element 1 produced as shown in FIGS. 2A to 2E which illustrate the method steps for producing the wavelength conversion element 1.

FIGS. 3A to 3G show schematic illustrations of method steps for a method for producing the wavelength conversion element by using an indirect patterning of the wavelength converting material 20.

Figure 3A:
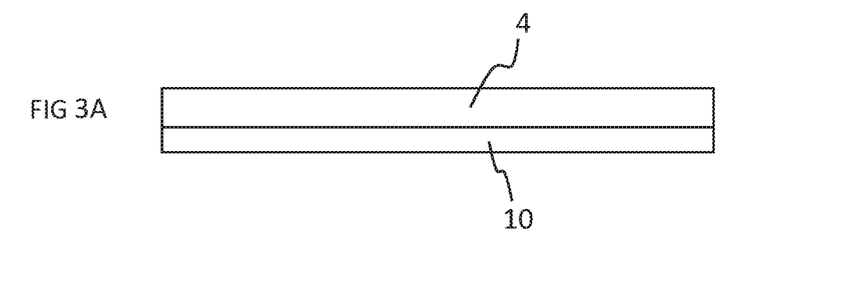

As shown in FIG. 3A, the support sheet 10 is provided wherein on the top side 11 of the support sheet 10 a photoresist 4 is arranged on the top side 11 of the support sheet 10.

Figure 3B:
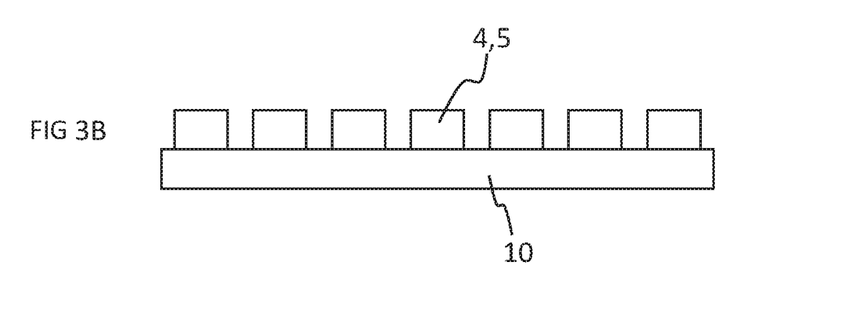

In FIG. 3B a further method step is shown wherein the photoresist 4 is patterned or structured by using photolithography. During the photolithography removable insular regions 5 are brought or positioned on the top side of the support sheet 10, wherein the removable insular regions 5 are spaced apart from each other.

Figure 3C:
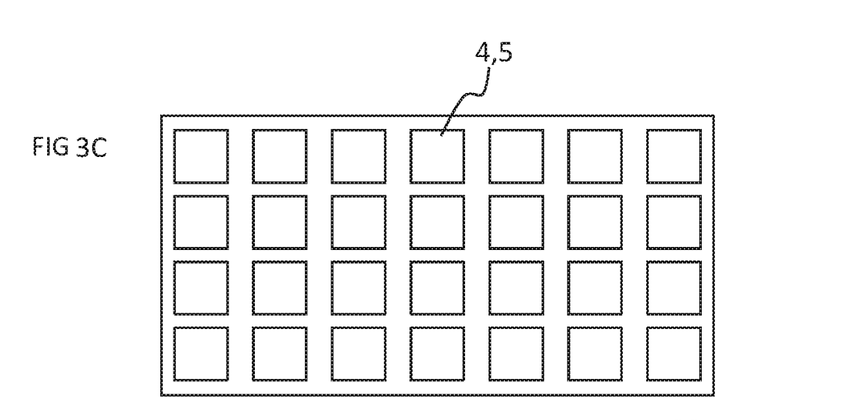
Figure 3D:
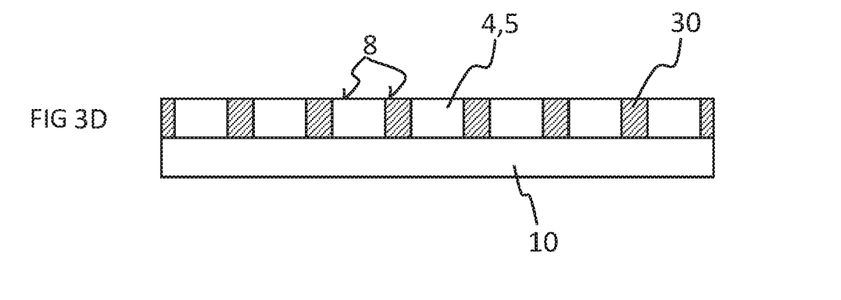

In FIG. 3D a top view of the removable insular regions and the spaces between the removable insular regions 5 are shown. As illustrated in FIG. 3C, channels are formed between the removable insular regions which results, as shown in FIG. 3C, in the grid 3.

In FIG. 3D the non-converting separator material 30 is filled between the removable insular regions such that the non-converting separator material 30 forms, with the removable insular regions 5, the common planar surface 8 which is positioned opposite to the support sheet 10.

Figure 3E:
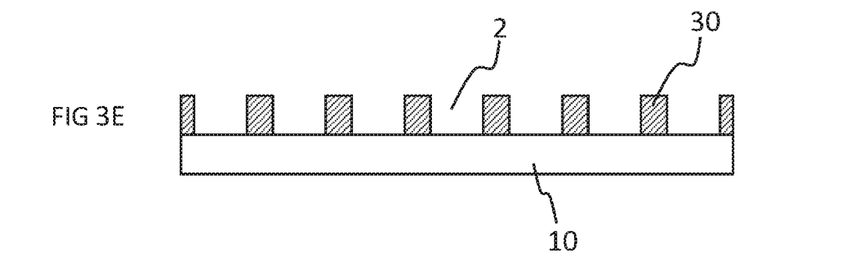

In a further method step, as shown in FIG. 3E, the removable insular regions are removed from the top side 11 of the support sheet 10. Thereby further channels 2 are formed. The channels 2 are formed between the non-converting separator material 30 which are free of non-converting separator material 30. Thus, the channels, as shown in FIG. 3E, are delimited in the lateral direction by the non-converting separator material 30 and in the vertical direction by the support sheet 10.

Figure 3F:
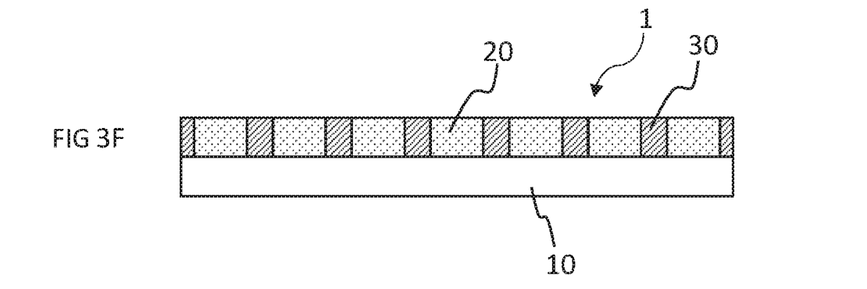
Figure 3G:
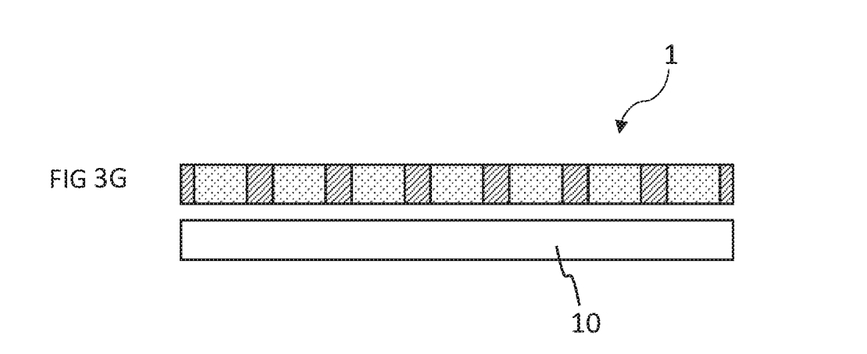

In a further method step, as shown in FIG. 3F, the slurry or the paste of the wavelength converting material 20 is filled in the channels 2. After pre-sintering and/or sintering the wavelength conversion element 1 is produced based on the indirectly patterning methods of the non-converting separator material 30 and the support sheet 10 is detached or removed from the now self-supporting wavelength conversion element 1.

In respect of the shown methods steps 3A to 3F it is also conceivable that the wavelength converting material 20 is firstly patterned by the insular regions 5 and the thereof resulting channels are filled with the non-converting separator material 30. That is to say that the method steps shown in FIGS. 3A to 3F are proceeded vice versa in respect of the wavelength converting material 20 and the non-converting separator material 30.

Figure 3H:
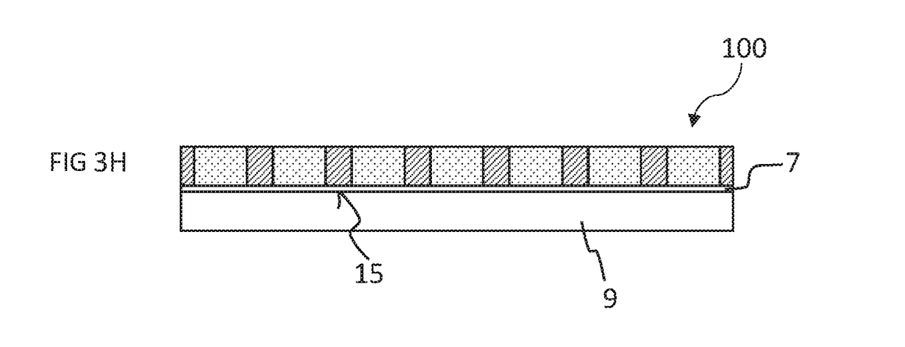
FIG. 3H shows a schematic side view of a light-emitting semiconductor component including the wavelength conversion element in accordance with FIGS. 3A to 3G, FIGS. 4A to 4E show schematic illustrations of method steps for a method for producing a wavelength conversion element in accordance with one exemplary embodiment.

In FIG. 3H in a schematic side view of a further embodiment of the light-emitting semiconductor component 100 is shown. The wavelength conversion element 1, which is based on the method steps as illustrated in FIGS. 3A to 3G, is arranged on the light coupling-out surface 15 of the light-emitting semiconductor chip 9 wherein between the wavelength conversion element 1 and the light-emitting semiconductor chip 9 the adhesive layer 7 is arranged.

The method steps shown in FIGS. 4A to 4E are also based on the indirect patterning method as shown in Figures FIGS. 3A to 3F.

Figure 4A:
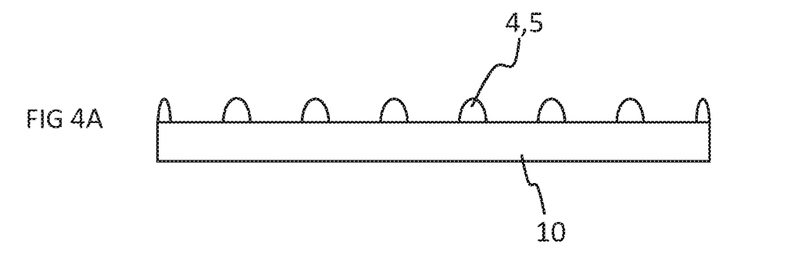
Figure 4B:
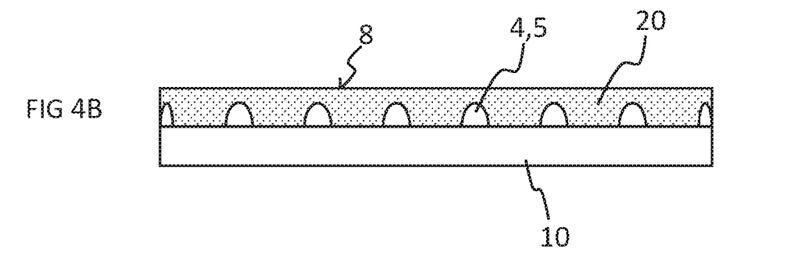
Figure 4C:
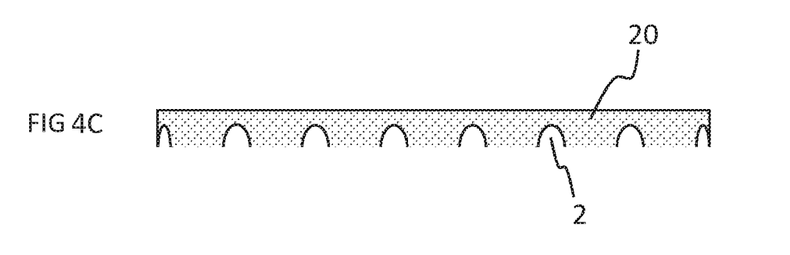
Figure 4D:
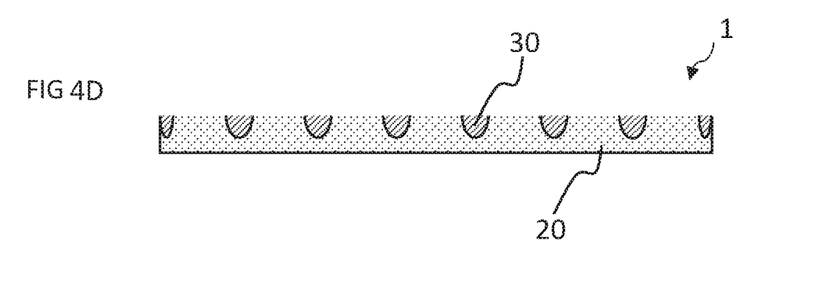
Figure 4E:
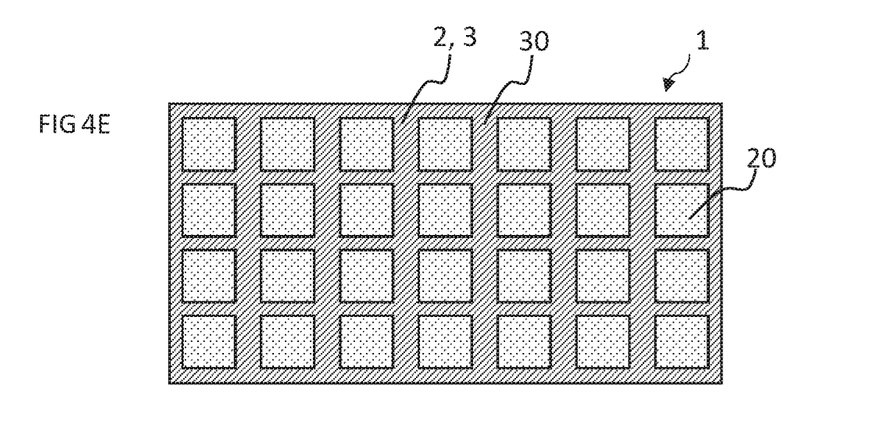

In FIG. 4A the support sheet 10 is shown wherein the removable insular regions 5 are spaced apart from each other on the top side 11 of the support sheet 10 and the removable insular regions 5 have a spherical shape. In contrast to the methods steps as shown in FIGS. 3A to 3G, the wavelength converting material 20 overlaps the removable insular regions 5 which can include or consist of the photoresist 4. The wavelength converting material 20 over-ranges the removable insular regions such that the wavelength converting material itself forms the planar surface 8. The planar surface 8 consisting of the wavelength converting material 20 is not interrupted by the non-converting separator material 30. The wavelength converting material 20 can then be dried and the support sheet, as well as the removable insular regions 5, can be removed accordingly. By removing the removable insular regions 5, the channels 2 are formed within the wavelength converting material 20 which then can be filled with the non-converting separator material 30. This can be executed as shown in FIGS. 4C to 4D by flipping the wavelength conversion element 1 around. In FIG. 4E a top view of the wavelength conversion element 1 is shown wherein the wavelength converting material 20 is completely surrounded by the non-converting separator material 30.

Figure 4F:
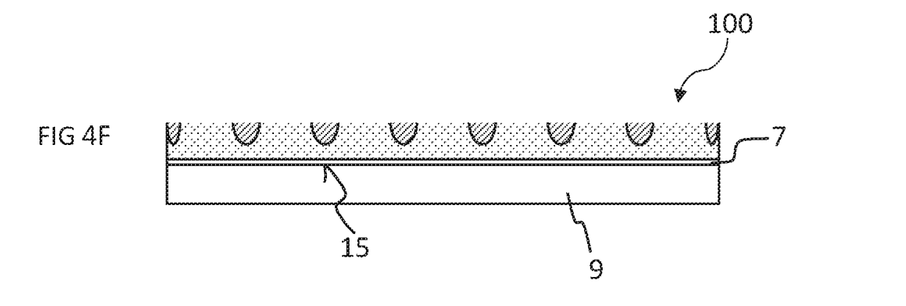
FIG. 4F shows a schematic side view of a light-emitting semiconductor component including the wavelength conversion element in accordance with FIGS. 4A to 4E.

FIG. 4F shows a side view of a light-emitting semiconductor component 100 including the wavelength conversion element 1 based on the methods steps as shown in FIGS. 4A to 4E, wherein the such produced wavelength conversion element 1 is glued by using the adhesive layer 7 on the light coupling-out surface 15 of the light-emitting semiconductor chip 9.

While the disclosed embodiments have been particularly shown and described with reference to specific embodiments, it should be understood by those skilled in the art that various changes in form and detail may be made therein without departing from the spirit and scope of the disclosed embodiments as defined by the appended claims. The scope of the disclosed embodiments is thus indicated by the appended claims and all changes which come within the meaning and range of equivalency of the claims are therefore intended to be embraced.

The invention claimed is:

1. A wavelength conversion element comprising at least one sintered wavelength converting material, wherein
a grid is formed by channels within the sintered wavelength converting material, the channels are at least partially surrounded by the sintered wavelength converting material,
the channels reach at least partially through the sintered wavelength converting material in a direction perpendicular or oblique to a main extension direction of the wavelength conversion element,
the channels contain a non-converting sintered separator material, and the non-converting sintered separator material is non-transmissive to ultraviolet and/or visible light, and
wherein the non-converting sintered separator material absorbs the ultraviolet and/or visible light.

2. The wavelength conversion element according to claim 1, wherein the channels extend at least partially parallel in the main extension direction of the wavelength conversion element.

3. The wavelength conversion element according to claim 1, wherein the channels completely reach through the sintered wavelength converting material or the channels partially reach through the sintered wavelength converting material.

4. The wavelength conversion element according to claim 1, wherein the sintered wavelength converting material contains a doped ceramic material selected from one or more of the following materials: YAG: Ce, LuAG:Ce, LuYAG:Ce.

5. The wavelength conversion element according to claim 1, wherein the sintered wavelength converting material contains one or more materials selected from the group: (AE)SiON, (AE)SiAlON, (AE)AlSiN$_3$, (AE)$_2$Si$_5$N$_8$, wherein AE is an alkaline earth metal; sulfides; orthosilicates.

6. The wavelength conversion element according to claim 1, wherein the sintered wavelength converting material contains a wavelength conversion substance dispersed in a matrix material.

7. The wavelength conversion element according to claim 1, wherein the non-converting sintered separator material contains carbon black.

8. A method for producing a wavelength conversion element, the method comprising:
providing a support sheet with a top side and a bottom side lying opposite the top side,
providing a wavelength converting material on the top side of the support sheet,
patterning the wavelength converting material directly or indirectly, thereby forming channels in the wavelength converting material which are at least partially surrounded by the wavelength converting material,
filling the channels with a slurry of non-converting separator material, wherein the non-converting material is non-transmissive to ultraviolet and/or visible light, and sintering the wavelength conversion element.

9. The method according to claim 8, wherein
the direct patterning of the wavelength converting material comprises:
forming the channels in a grid-like pattern within the wavelength converting material by selectively removing the wavelength converting material, whereby the channels completely reach, at least in places, through the wavelength converting material, and whereby regions at least partially free of the wavelength converting material are formed.

10. The method according to claim 9, wherein
the direct patterning is performed such that in addition the channels reach at least partially through the support sheet.

11. The method according to claim 8, wherein the indirect patterning of the wavelength converting material comprises:
bringing removable insular regions on the top side of the support sheet, wherein the removable insular regions are spaced apart from each other, the wavelength converting material is filled at least in places between the removable insular regions, and the insular regions are removed from the top side of the support sheet, thereby forming the channels.

12. The method according to claim 11, wherein the removable insular regions comprise a photoresist.

13. The method according to claim 8, wherein the support sheet comprises an undoped ceramic sheet.

14. The method according to claim 8, wherein the wavelength conversion element is pre-sintered before sintering.

15. A light-emitting semiconductor component comprising a pixelated light-emitting semiconductor chip, which emits primary radiation during operation via a light coupling-out surface along an emission direction, and a wavelength conversion element,
the wavelength conversion element comprising at least one sintered wavelength converting material, wherein
a grid is formed by channels within the sintered wavelength converting material,
the channels are at least partially surrounded by the sintered wavelength converting material,
the channels reach at least partially through the sintered wavelength converting material in a direction perpendicular or oblique to a main extension direction of the wavelength conversion element,
the channels contain a non-converting sintered separator material, and
the non-converting sintered separator material is non-transmissive to ultraviolet and/or visible light,
wherein the non-converting sintered separator material absorbs the ultraviolet and/or visible light,
wherein the wavelength conversion element is arranged on the light coupling-out surface of the light-emitting semiconductor chip.

* * * * *

UNITED STATES PATENT AND TRADEMARK OFFICE
CERTIFICATE OF CORRECTION

PATENT NO.        : 9,806,240 B2
APPLICATION NO.   : 15/120755
DATED             : October 31, 2017
INVENTOR(S)       : Britta Goeoetz et al.

It is certified that error appears in the above-identified patent and that said Letters Patent is hereby corrected as shown below:

In the Specification

Column 9, Line 46: Please insert the number --12-- between the words "side" and "are"
Column 11, Line 40: Please insert the number --1-- between the words "element" and "by"
Column 11, Line 49: Please insert the number --11-- between the words "side" and "of"

Signed and Sealed this
Twenty-sixth Day of December, 2017

Joseph Matal
*Performing the Functions and Duties of the*
*Under Secretary of Commerce for Intellectual Property and*
*Director of the United States Patent and Trademark Office*